(12) United States Patent
Okuda et al.

(10) Patent No.: US 9,226,436 B2
(45) Date of Patent: Dec. 29, 2015

(54) COMPONENT MOUNTING POSITION CORRECTING METHOD

(75) Inventors: Osamu Okuda, Osaka (JP); Hiroharu Tokunaga, Yamanashi (JP); Hideaki Katou, Yamanashi (JP); Tomio Tanaka, Yamanashi (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/125,369

(22) PCT Filed: May 11, 2012

(86) PCT No.: PCT/JP2012/003109
§ 371 (c)(1),
(2), (4) Date: Dec. 11, 2013

(87) PCT Pub. No.: WO2013/031057
PCT Pub. Date: Feb. 7, 2013

(65) Prior Publication Data
US 2014/0130348 A1 May 15, 2014

(30) Foreign Application Priority Data

Aug. 29, 2011 (JP) ................................. 2011-186571

(51) Int. Cl.
*H05K 13/04* (2006.01)
(52) U.S. Cl.
CPC ............ *H05K 13/0413* (2013.01); *H05K 13/04* (2013.01); *Y10T 29/49131* (2015.01); *Y10T 29/53174* (2015.01)
(58) Field of Classification Search
CPC .............. H05K 15/0413; H05K 13/04; H05K 13/0404; H05K 13/0408; H05K 13/0413; Y10T 29/4913; Y10T 29/49131; Y10T 29/49133; Y10T 29/53174; Y10T 29/53178; Y10T 29/53183; Y10T 29/53191
See application file for complete search history.

(56) References Cited

U.S. PATENT DOCUMENTS 5,131,139 A * 7/1992 Oyama et al. .................. 29/721
5,224,262 A * 7/1993 Takaichi et al. ................ 29/721
(Continued)

FOREIGN PATENT DOCUMENTS

| CN | 101574025 | 11/2009 |
|----|-----------|---------|
| JP | 4-63197   | 5/1992  |
| JP | 05-63398  | 3/1993  |
| JP | 08-139498 | 5/1996  |

(Continued)

OTHER PUBLICATIONS

International Search Report issued Jun. 12, 2012 in International (PCT) Application No. PCT/JP2012/003109.
(Continued)

*Primary Examiner* — Livius R Cazan
(74) *Attorney, Agent, or Firm* — Wenderoth, Lind & Ponack, L.L.P.

(57) ABSTRACT

A component mounter includes: a nozzle having a nozzle main body and a reflecting part provided behind the nozzle main body and reflecting light from the front, the nozzle main body including a greatest outer periphery section provided to a front section of the nozzle main body, and the greatest outer periphery section of an outer periphery of the nozzle main body provided in front on the reflecting part; a first illuminating unit provided in front of the reflecting part and illuminating the reflecting part from the front with light; and an imaging unit provided in front of the nozzle and capturing the greatest outer periphery section positioned in front of the nozzle main body, using the light from the first illuminating light and reflected off the reflecting part.

6 Claims, 11 Drawing Sheets

(56) References Cited

U.S. PATENT DOCUMENTS

| | | | |
|---|---|---|---|
| 5,311,304 A * | 5/1994 | Monno | 348/87 |
| 5,383,270 A * | 1/1995 | Iwatsuka et al. | 29/840 |
| 5,526,974 A * | 6/1996 | Gordon et al. | 228/103 |
| 5,768,759 A * | 6/1998 | Hudson | 29/407.04 |
| 6,285,782 B1 * | 9/2001 | Inoue et al. | 382/145 |
| 7,089,656 B2 | 8/2006 | Nagao et al. | |
| 2004/0109172 A1 | 6/2004 | Nagao et al. | |
| 2010/0097461 A1 | 4/2010 | Utsumi et al. | |
| 2015/0215503 A1 | 7/2015 | Utsumi et al. | |

FOREIGN PATENT DOCUMENTS

| | | |
|---|---|---|
| JP | 2000-308987 | 11/2000 |
| JP | 2004-186384 | 7/2004 |
| JP | 3847070 | 11/2006 |
| JP | 4015402 | 11/2007 |

OTHER PUBLICATIONS

Chinese Office Action issued Oct. 9, 2015 for the corresponding Chinese patent application No. 201280028712.3 (with English translation).

* cited by examiner

COMPONENT MOUNTING POSITION CORRECTING METHOD

TECHNICAL FIELD

The present invention relates to a component mounter which includes a nozzle for holding a component and mounts on a board the component held by the nozzle, the nozzle, and a component mounting position correcting method.

BACKGROUND ART

Component mounters hold components by nozzles and mount the components on boards. It is important for such component mounters to mount the components at correct positions on the boards. Components, however, could be misaligned when mounted on a board.

Hence, some conventional and disclosed component mounters correct misalignment caused when a component is mounted on a board, and mount the component at the correct position on a board (see Japanese Patent No. 3847070 and Japanese Patent No. 4015402).

The component mounter disclosed in Japanese Patent No. 3847070 captures a surface A provided behind a nozzle and a surface B found at the tip of the nozzle. This allows the component mounter to recognize the positions of the nozzle and the component, and correct misalignment caused when the component is mounted on a board.

The component mounter disclosed in Japanese Patent No. 4015402 emits light to a reflecting surface provided at the tip of a nozzle and captures the image of the light reflected off the reflecting surface. The component mounter also emits light to a component held on the nozzle, and captures the image of the component. This allows the component mounter to recognize the positions of the nozzle and the component, and correct misalignment caused when the component is mounted on a board.

Technical Problem

Unfortunately, the above conventional component mounters have problems that the mounters fail to precisely recognize positions of nozzles, and therefore cannot accurately correct misalignment caused when components are mounted on boards.

The component mounter disclosed in Japanese Patent No. 3847070 captures the surface A provided behind a nozzle to recognize the position of the nozzle. An imaging unit of the component mounter, however, cannot get a sharp focus on the position behind the nozzle, and fails to capture an accurate image of the surface A. Consequently, the component mounter fails to precisely recognize the position of the nozzle, and cannot accurately correct misalignment caused when a component is mounted on a board.

The component mounter disclosed in Japanese Patent No. 4015402 recognizes the position of the nozzle by emitting light to the reflecting surface and capturing an image of the reflected light. However, if the reflecting surface is not sufficiently polished and thus some uneven spots are found, the outline of the reflecting surface captured by the imaging unit would appear blurry and unclear, and the component mounter cannot accurately recognize the reflecting surface. Consequently, the component mounter fails to precisely recognize the position of the nozzle, and cannot accurately correct misalignment caused when a component is mounted on a board.

SUMMARY OF INVENTION

The present invention is conceived in view of the above problems and aims to provide a component mounter which can accurately correct misalignment caused when a component is mounted on a board, a nozzle, and a component mounting position correcting method.

In order to achieve the above aim, a component mounter according to an aspect of the present invention mounts a component on a board. The component mounter including: a nozzle holding the component and including: a nozzle main body as a main body of the nozzle; and a reflecting part provided behind the nozzle main body and reflecting light from front. The nozzle main body includes a greatest outer periphery section provided to a front section of the nozzle main body, and the greatest outer periphery section is positioned, when seen from front, in an outermost part of an outer periphery of the nozzle main body. The component mounter further includes: a first illuminating unit provided in front of the reflecting part and illuminating the reflecting part from front with the light; and an imaging unit provided in front of the nozzle and capturing the greatest outer periphery section, using the light from the first illuminating unit and reflected off the reflecting part.

Hence, the component mounter includes the greatest outer periphery section provided to the front section of the nozzle main body and positioned, when seen from front of the nozzle main body, the outermost of the outer periphery of the nozzle main body positioned in front of the reflecting part. The component mounter captures the greatest outer periphery section using the light reflected off the reflecting part behind the nozzle main body. In other words, the greatest outer periphery section is provided to the front section of the nozzle main body. This feature allows the imaging unit to practically get a sharp focus to capture the greatest outer periphery section, and the obtained image of the greatest outer periphery section is accurate. Moreover, the image of the greatest outer periphery section is obtained not with the light with which the greatest outer periphery section is illuminated. Instead, the image of the greatest outer periphery section, which is provided to the front section of the nozzle main body, is obtained with the light reflected off the reflecting part behind the nozzle main body. As a result, such a feature keeps the outline of the greatest outer periphery section from being blurry (reduces the blur), and contributes to obtaining an accurate image of the greatest outer periphery section. Consequently, the component mounter can precisely recognize the position of the nozzle, and accurately correct misalignment caused when the component is mounted on the board.

Preferably, the nozzle main body includes a frontal part provided opposite the imaging unit and having the greatest outer periphery section as an outer periphery of the frontal part, the frontal part being non-reflective for keeping from the reflection of the light.

Thanks to this feature, the nozzle main body includes the non-reflective frontal part provided opposite the imaging unit and whose outer periphery is the greatest outer periphery section. Hence, the component mounter can accurately perform transmissive recognition for capturing a silhouette of the greatest outer periphery section, using the light reflected off the reflecting part. Consequently, the component mounter can precisely recognize the position of the nozzle, and accurately correct misalignment caused when the component is mounted on the board.

Preferably, the nozzle main body includes an edge part whose width in a front-back (first) direction reduces toward the greatest outer periphery section in a direction perpendicular to the front-back direction.

Thanks to this feature, the nozzle main body includes the edge part whose width in the front-back direction reduces toward the greatest outer periphery section. Such a feature allows the component mounter to capture the edge part, such that the outline of the greatest outer periphery section is less blurry. This contributes to obtaining an accurate image of the greatest outer periphery section. Consequently, the component mounter can precisely recognize the position of the nozzle, and accurately correct misalignment caused when the component is mounted on the board.

Preferably, the edge part is shaped such that a distance between the outer periphery and an axis of the nozzle main body decreases as the outer periphery stretches further back.

Thanks to this feature, the distance between the outer periphery and the axis of the nozzle main body decreases as the edge part stretches further back (Z-axis plus direction). Hence, the nozzle main body can be formed in a candle-like shape.

Preferably, the greatest outer periphery section is positioned at a distance of 4 mm or shorter away from the tip of the nozzle main body in a front-back direction.

Thanks to this feature, the greatest outer periphery section is positioned at a distance of 4 mm or shorter away from the tip of the nozzle main body in a front-back direction. In other words, the greatest outer periphery section is provided to a position which allows the imaging unit to get a practically sharp focus in consideration of the depth of focus of the imaging unit. This feature allows the imaging unit to practically get a sharp focus and obtain an accurate image of the greatest outer periphery section. Consequently, the component mounter can precisely recognize the position of the nozzle, and accurately correct misalignment caused when the component is mounted on the board.

Preferably, the nozzle main body includes a separate part having the greatest outer periphery section in the outer periphery.

Thanks to this feature, a part of the main nozzle body and for the greatest outer periphery section in the outer periphery may be formed separately. Hence, the greatest outer periphery is manufactured and attached to the nozzle main body, which forms the nozzle having the greatest outer periphery section in the front section of the nozzle main body. Such a feature contributes to simple manufacturing of the nozzle and reduction of the manufacturing cost.

Preferably, the component mounter further includes: a position obtaining unit obtaining a reference position of the nozzle based on a result of capturing the greatest outer periphery section by the imaging unit; and a position correcting unit correcting a position of the nozzle, using the obtained reference position of the nozzle.

Thanks to these features, the component mounter obtains the reference position of the nozzle from the result of capturing the greatest outer periphery section by the imaging unit, and corrects the position of the nozzle. Such features make it possible to precisely correct the position of the nozzle, using the reference position of the nozzle. Consequently, the component mounter can accurately correct misalignment caused when the component is mounted on the board.

Preferably, the component mounter further includes a second illuminating unit configured to illuminate with light the component held by the nozzle, wherein the imaging unit further captures the component, using the light emitted from the second illuminating unit, the position obtaining further obtains the reference position of the component based on a result of capturing the component captured by the imaging unit, and the position correcting unit corrects the position of the nozzle to correct a mounting position where the nozzle mounts the component, using a positional relationship between the nozzle and the component, the positional relationship being obtained from the obtained reference position of the nozzle and the obtained reference position of the component.

Thanks to these features, the component mounter obtains the reference position of the component based on an image of the component captured by the imaging unit. Then, using a positional relationship between the nozzle and the component that is obtained from the reference positions of the nozzle and the component, the component mounter corrects the position of the nozzle to correct the mounting position where the nozzle mounts the component. Such features make it possible to precisely correct the position of the nozzle, using the reference positions of the nozzle and the component. Consequently, the component mounter can accurately correct misalignment caused when the component is mounted on the board.

In order to achieve the above aim, a nozzle according to an aspect of the present invention is included in a component mounter for mounting a component on a board. The nozzle holds the component and includes: a nozzle main body as a main body of the nozzle; and a reflecting part provided behind the nozzle main body and reflecting light from front, wherein the nozzle main body includes a greatest outer periphery section provided to a front section of the nozzle main body, the greatest outer periphery section being positioned, when seen from front, in an outermost part of an outer periphery of the nozzle main body.

Thanks to these features, the nozzle includes the nozzle main body, the reflecting part behind the nozzle main body, and the greatest outer periphery section provided to the front section of the nozzle main body and, when seen from front, positioned the outermost of the outer periphery of the nozzle main body. When capturing the greatest outer periphery section provided to the front section of the nozzle main body, the above features allow the component mounter to practically get a sharp focus to capture the greatest outer periphery section, and the obtained image of the greatest outer periphery section is accurate. Furthermore, the component mounter captures the greatest outer periphery section using light reflected off the reflecting part behind the nozzle main body. Such a feature makes the outline of the greatest outer periphery section less blurry than directly illuminating with light for capturing the greatest outer periphery section, and contributes to obtaining an accurate image of the greatest outer periphery section. Consequently, the component mounter can precisely recognize the position of the nozzle, and the nozzle can accurately correct misalignment caused when the component is mounted on the board.

In order to achieve the above aim, a component mounting position correcting method according to an aspect of the present invention is for correcting a mounting position on a board where a component mounter, including a nozzle for holding a component, mounts the component held by the mounter. The nozzle includes a nozzle main body as a main body of the nozzle; and a reflecting part provided behind the nozzle main body and reflecting light from front. The nozzle main body including a greatest outer periphery section provided to a front section of the nozzle main body and spaced apart forwardly from the reflecting part, and the greatest outer periphery section being positioned, when seen from front (i.e., when viewed along the first direction), in an outermost part of an outer periphery of the nozzle main body. The component mounting position correcting method includes: illuminating the reflecting part from front with the light; capturing the greatest outer periphery section, using the light in the illuminating and reflected off the reflecting part; obtaining a reference position of the nozzle based on a result of the capturing the greatest outer periphery section in the capturing; and correcting a position of the nozzle to correct the mounting position where the nozzle mounts the component, using the obtained reference position of the nozzle.

Thanks to these features, the component mounting position correcting method involves illuminating the reflecting part with light to capture the greatest outer periphery section using the light reflected off the reflecting part, obtaining the reference position of the nozzle based on the image of the greatest outer periphery section, and correcting the position of the nozzle based on the reference position of the nozzle to correct the mounting position where the nozzle mounts the component. Such features make it possible to precisely correct the position of the nozzle, using the reference position of the nozzle. Consequently, the component mounter can accurately correct misalignment caused when the component is mounted on the board.

Preferably, the component mounting position correcting method further includes illuminating with light the component held by the nozzle; capturing the component, using the light emitted to the component; and obtaining a reference position of the component based on a result of capturing the component, wherein the correcting involves correcting the position of the nozzle to correct where the nozzle mounts the component, using a positional relationship between the nozzle and the component, the positional relationship being obtained from the obtained reference position of the nozzle and the obtained reference position of the component.

Thanks to these features, the component mounting position correcting method involves capturing the component with light emitted to the component, obtaining the reference position of the component based on the captured image of the component. Then, using a positional relationship between the nozzle and the component that is obtained from the reference positions of the nozzle and the component, the component mounting position correcting method involves correcting the position of the nozzle to correct the mounting position where the nozzle mounts the component. Such features make it possible to precisely correct the position of the nozzle, using the reference positions of the nozzle and the component. Consequently, the component mounter can accurately correct misalignment caused when the component is mounted on the board.

It is noted that the present invention can be implemented not only as the component mounting position correcting method but also as a program and an integrated circuit to cause a computer to execute the characteristic steps included in the component mounting position correcting method. As a matter of course, the program may be distributed via a recording medium such as a CD-ROM and a transmission medium such as the Internet.

The present invention can provide a component mounter which can accurately correct misalignment caused when a component is mounted on a board.

DESCRIPTION OF EMBODIMENT

Hereinafter, a component mounter according to an embodiment of the present invention will be described with reference to the drawings.

Figure 1:
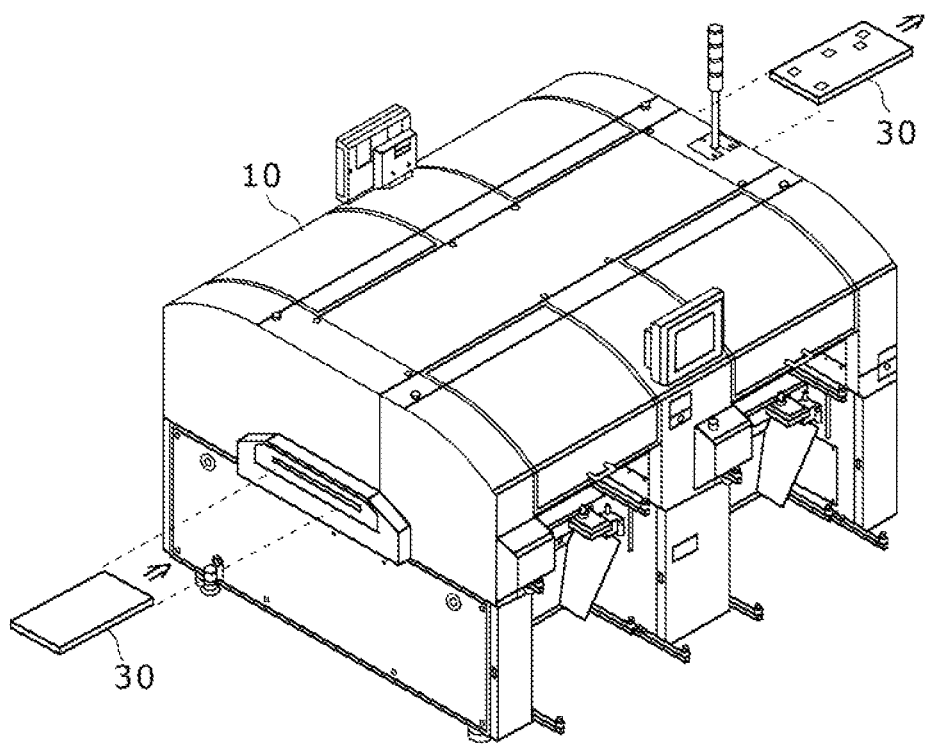
FIG. 1 is an outer view showing a structure of a component mounter according to an embodiment of the present invention.

FIG. 1 is an outer view showing a structure of a component mounter 10 according to the embodiment of the present invention.

Figure 2:
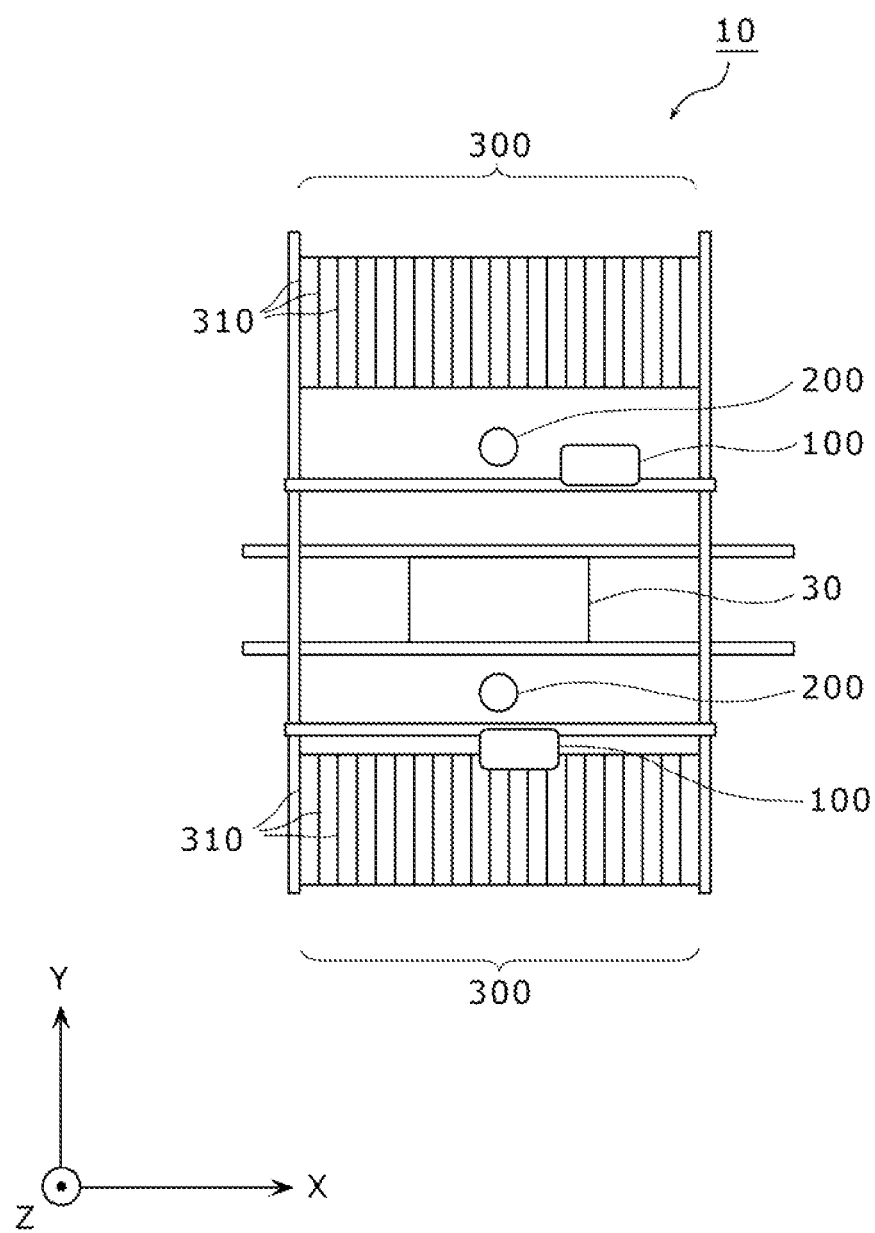
FIG. 2 is a plan view showing a main internal structure of the component mounter according to the embodiment of the present invention.

FIG. 2 is a plan view showing a main internal structure of the component mounter 10 according to the embodiment of the present invention.

As shown in FIG. 1, the component mounter 10 mounts components on a board 30 to manufacture a mounted board. The component mounter 10 includes a controlling device 20 (not shown in FIG. 1). The controlling device 20 is a computer for controlling an operation of the component mounter 10. Details of the controlling device 20 will be described later. The controlling device 20 may also be a computer, such as a personal computer disposed outside the component mounter 10.

Moreover, as shown in FIG. 2, the component mounter 10 includes two mounting units for mounting the components on the board 30. The two mounting units operate together to mount the components on one board 30. Each of the mounting units includes a head 100, an imaging device 200, and a component supplying unit 300.

The component supplying unit 300 includes a series of component feeders 310 each containing a component tape. It is to be noted that the component tape is, for example, supplied in a state as follows: multiple components of the same type are aligned at even intervals on a tape (carrier tape); and the tape is wound on, for example, a reel. Moreover, examples of the components aligned in the component tape include a ball grid array (BGA) and a chip component.

The head 100 including multiple nozzles and picks up components in the component tape contained in the component feeders 310 using suction by corresponding nozzles, transports the picked-up components over the board 30, and mounts the components on the board 30. It is to be noted that details of the nozzles will be described later.

The imaging device 200 captures a component held by the head 100 from below the component, and is used for recognizing the component. Specifically, the imaging device 200 captures the component picked up by the nozzle of the head 100, and examines the state of the suctioning for the component two-dimensionally or three-dimensionally. It is to be noted that details of the controlling device 200 will be described later.

Figure 3:
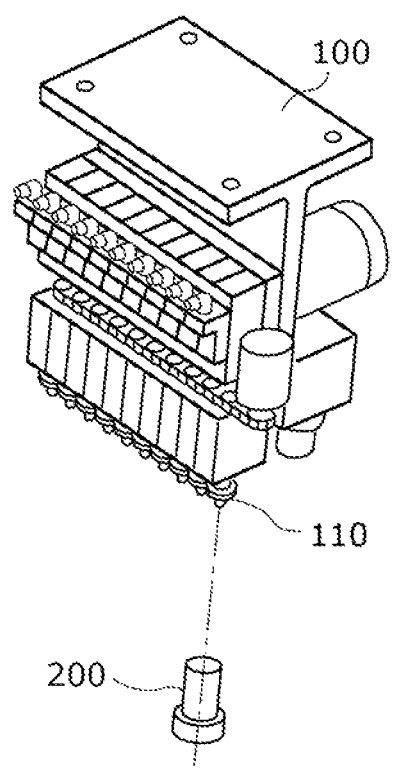
FIG. 3 is a diagram showing a positional relationship between a head and an imaging device according to the embodiment.
Figure 3:
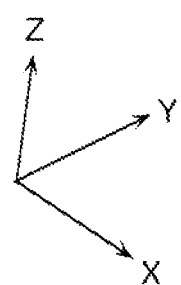

FIG. 3 is a diagram showing a positional relationship between the head 100 and the imaging device 200 according to the embodiment.

As shown in FIG. 3, the head 100 includes multiple nozzles 110 each of which picks up a component. In the embodiment, the nozzle 110 holds a component by vacuum suction. Moreover, the head 100 has a mechanism to independently and vertically move each of the nozzles 110 in the Z-axis direction. The head 100 holds and transports components, and mounts the components on the board 30.

In other words, the head 100 causes the nozzles 110 to pick up and hold the components arranged in the component supplying unit 300, and travels such that the nozzles 110 are positioned above the imaging device 200. Then, the imaging device 200 captures each nozzle 110 and the component held by the nozzle 110, and recognizes the positions of the nozzle 110 and the component.

The head 100 then moves each of the nozzles 110 to a mounting position on the board 30. Based on the result of the capture by the imaging device 200, the head 100 corrects the position of the nozzle 110 and mounts the component held by the nozzle 110.

Described next are detailed structures of the nozzle 110 and the imaging device 200.

Figure 4:
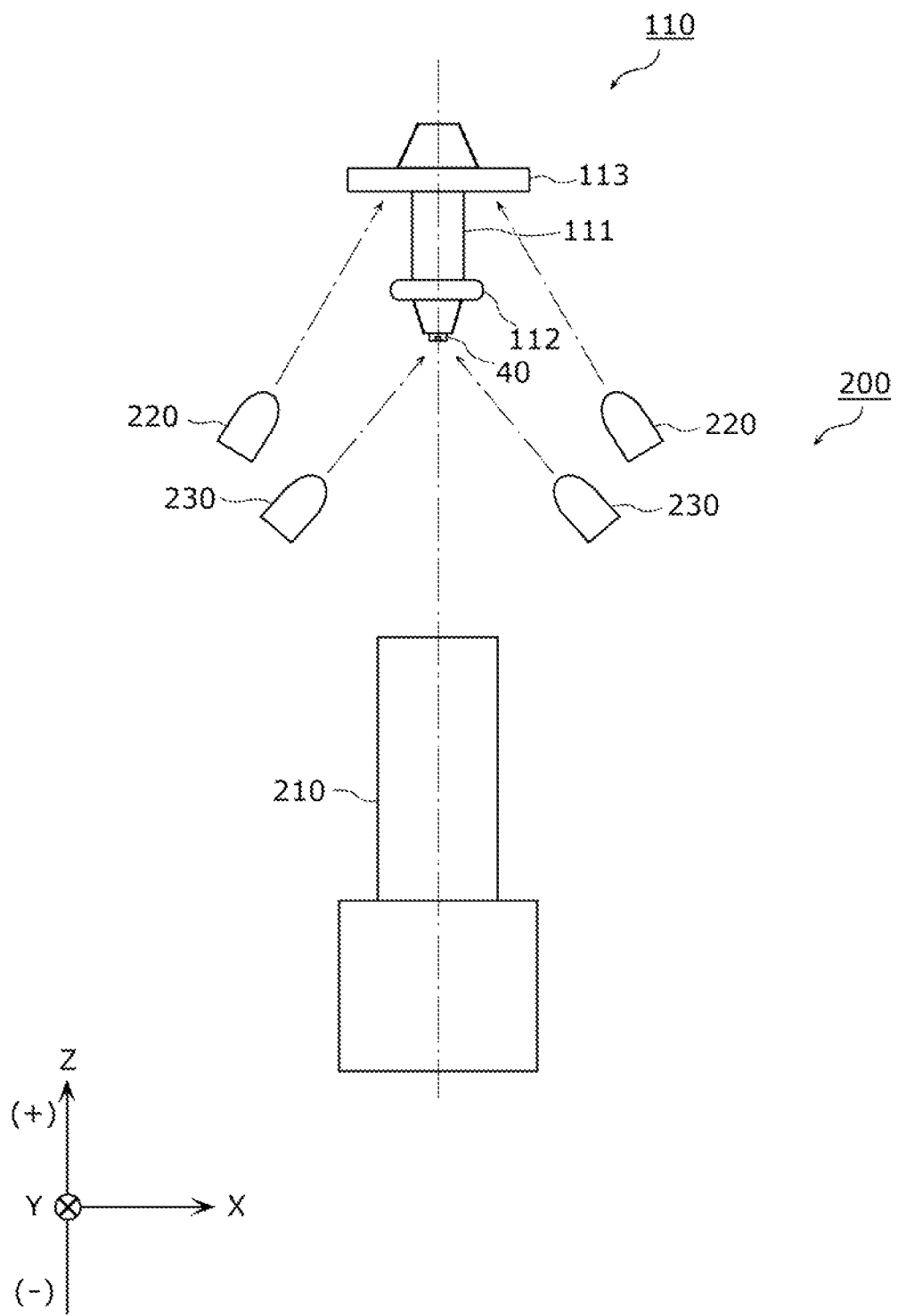
FIG. 4 is a diagram showing structures of a nozzle and an imaging device according to the embodiment of the present invention.

FIG. 4 is a diagram showing structures of the nozzle 110 and the imaging device 200 according to the embodiment of the present invention.

As shown in FIG. 4, the nozzle 110 includes a nozzle main body 111 as the main body of the nozzle 110, and a reflecting part 113 provided behind the nozzle main body 111. The nozzle main body 111 has a greatest outer periphery 112 in the front section thereof.

Figure 5A:
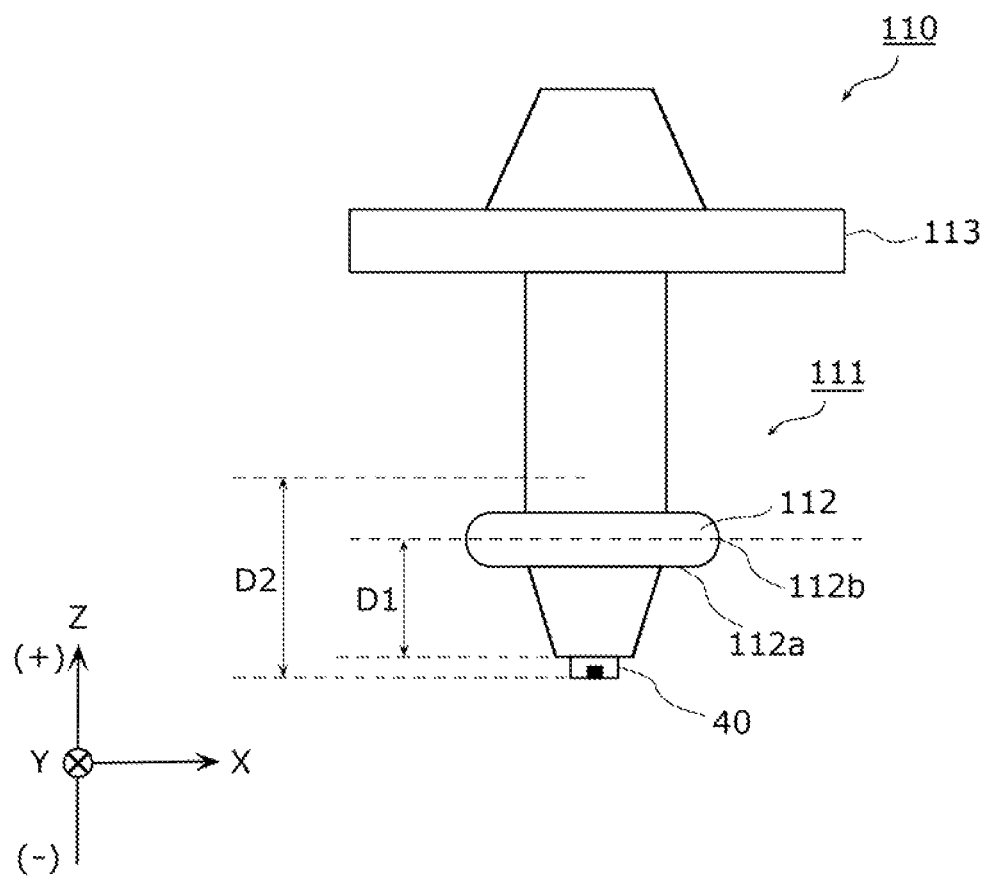
FIG. 5A is a diagram showing a structure of a nozzle main body of the nozzle according to the embodiment of the present invention.

In other words, the nozzle 110 has the reflecting part 113 in the back section thereof and the greatest outer periphery 112 in the front section. In FIG. 5A, "front" refers to the forward portion, "forward" means the downward direction (Z-axis minus direction), "back (or "rear")" refers to the rearward portion, and "rearward" means the upward direction (Z-axis plus direction).

The reflecting part 113 reflects light from front (Z-axis minus side). Specifically, the reflecting part 113 is a disk-shaped reflecting part made of aluminum and used for reflecting light. It is noted that the reflecting part 113 shall not be limited to the one made of aluminum and shaped in a disk. The reflecting part 113 may be made of any given material and into any given shape as far as the reflecting part 113 can reflect light.

The greatest outer periphery 112 includes a greatest outer periphery section. The greatest outer periphery section is positioned, when seen from the front (Z-axis minus side) (i.e., when viewed along the first direction), in the outermost part of the outer periphery of the nozzle main body 111 positioned in front of the reflecting part 113. In other words, the greatest outer periphery 112 has the largest outside diameter of the nozzle main body 111, and is doughnut-shaped and made of, for example, ceramic. The details of the greatest outer periphery section shall be described later.

It is noted that, in the embodiment, the greatest outer periphery 112 is separately provided from other parts of the nozzle main body 111; however, the greatest outer periphery 112 may be integrally formed with other parts of the nozzle main body 111. Moreover, the material and shape of the greatest outer periphery 112 shall not be limited to ceramic and a doughnut-like shape. Instead, the material may be metal or resin, and the shape may be cylindrical.

The imaging device 200 includes an imaging unit 210 and a second illuminating unit 230.

A first illuminating unit 220 of the imaging device 200 is a light-emitting device provided in front of the reflecting part 113, and illuminating the reflecting part 113 from the front with light. It is noted that all the first illuminating unit 220 has to do is to send light to the reflecting part 113, and the first illuminating unit 220 itself does not have to emit light.

The second illuminating unit 230 is a light-emitting device illuminating with light a component 40 held by the nozzle 110. It is noted that all the second illuminating unit 230 has to do is to send light to the component 40, and the second illuminating unit 230 itself does not have to emit light.

The imaging unit 210 is a camera provided in front of the nozzle 110. The imaging unit 210 captures the greatest outer periphery section of the greatest outer periphery 112 positioned in the front section of the nozzle main body 111, using the light from the first illuminating unit 220 and reflected off the reflecting part 113. Moreover, the imaging unit 210 further captures the component 40, using the light emitted from the second illuminating unit 230.

Described next is the detailed structure of the nozzle main body 111 of the nozzle 110.

Figure 5B:
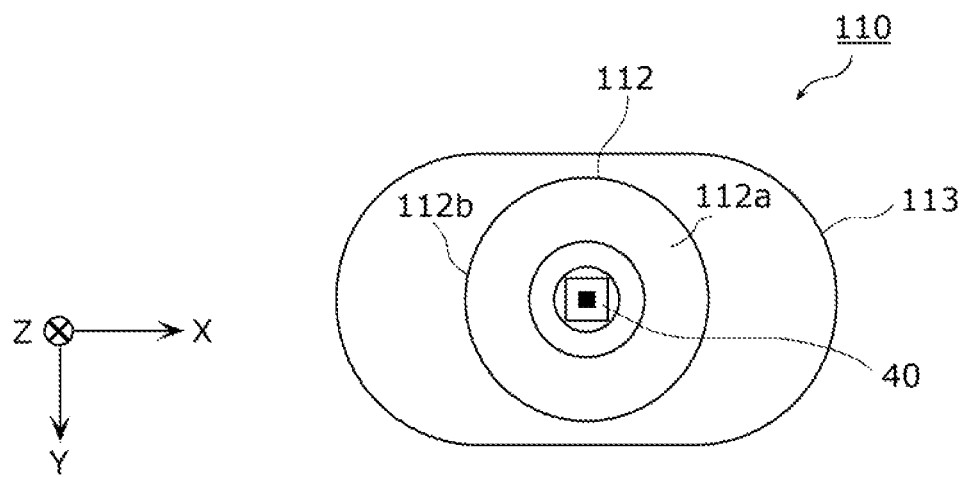
FIG. 5B is a diagram showing a structure of the nozzle main body of the nozzle according to the embodiment of the present invention.

FIGS. 5A and 5B are diagrams showing the structure of the nozzle main body 111 of the nozzle 110 according to the embodiment of the present invention. FIG. 5B shows the nozzle 110 illustrated in FIG. 5A as viewed from the front.

As shown in the drawings, the greatest outer periphery 112 of the nozzle main body 111 has a frontal part 112a in its front section (surface on the Z-axis minus side) and a greatest outer periphery section 112b on its outer periphery. The greatest outer periphery 112 is doughnut-shaped, and is between 2 mm and 3 mm in outside diameter, approximately 1.5 mm in inside diameter, and approximately 1 mm in thickness. The greatest outer periphery 112, however, shall not be limited to this shape.

Seen from the front (Z-axis minus side), the greatest outer periphery section 112b is positioned outermost of the outer periphery of the nozzle main body 111 positioned in front of the reflecting part 113. In other words, the greatest outer periphery section 112b is the greatest of the outer periphery of the nozzle main body 111. The greatest outer periphery section 112b is a circular part having a diameter of, for example, between 2 mm and 3 mm.

Moreover, the greatest outer periphery section 112b is positioned at the distance D1 of 4 mm or shorter away from the tip of the nozzle main body 111 in the front-back (first) direction (Z-axis direction). For example, the greatest outer periphery section 112b is positioned between the distance of 0.4 mm and 4 mm. Preferably, the greatest outer periphery section 112b is located at a position between the distance D1 of 0.4 mm and 3 mm. Here, the imaging device 200 is to capture a substantially accurate image of a position of the greatest outer periphery section 112b, for example the center of the greatest outer periphery section 112b, found between the front surface (surface on the Z-axis minus side) of the component 40 and a position located rearward (Z-axis plus direction) from the front surface as far as a distance D2.

Specifically, for example, the distance D2 is shorter than or equal to eight to ten times of the thickness of a component whose image is captured by the imaging device 200. Preferably, the distance D2 is approximately twice to five times greater than the thickness of the component. In other words, at an approximate depth of focus with which the imaging device 200 can practically obtain an image, the greatest outer periphery section 112b is positioned within the distance D2 which allows the imaging device 200 to accurately obtain the image. Consequently, the imaging device 200 can obtain a practically accurate image of the greatest outer periphery section 112b. It is noted that the component 40 is a component having a thickness (thickness in the Z-axis direction) of approximately 0.2 mm to 0.4, such as 0404 chip components and 0603 chip components.

The frontal part 112a is a frontal part of the greatest outer periphery 112 of the nozzle main body 111 provided opposite the imaging unit 210. The frontal part 112a has the greatest outer periphery section 112b as the outer periphery of the frontal part 112a. The frontal part 112a is a non-reflective one which keeps from reflection of light. In other words, the frontal part 112a is a non-diffusible surface whose color, such as a black color and a dark color, is complementary to the color of light to be emitted.

It is noted that the distance D1, which (in the Z-axis direction) stretches in the front-back direction between the greatest outer periphery section 112b and the tip face of the nozzle main body 111, is between 0.4 mm and 4 mm, and the lower limit is not 0 mm. This is because a gap (space) is provided between the frontal part 112a and the pick-up surface of the nozzle 110 for the component 40. In other words, when the component 40 is mounted, the gap can prevent the interference between a neighboring component which has already been mounted and the frontal part 112a to keep the frontal part 112a from catching pollutants. Consequently, such a feature contributes to maintaining high image quality of an image of the greatest outer periphery section 112b.

Detailed next is the controlling device 20 included in the component mounter 10.

Figure 6:
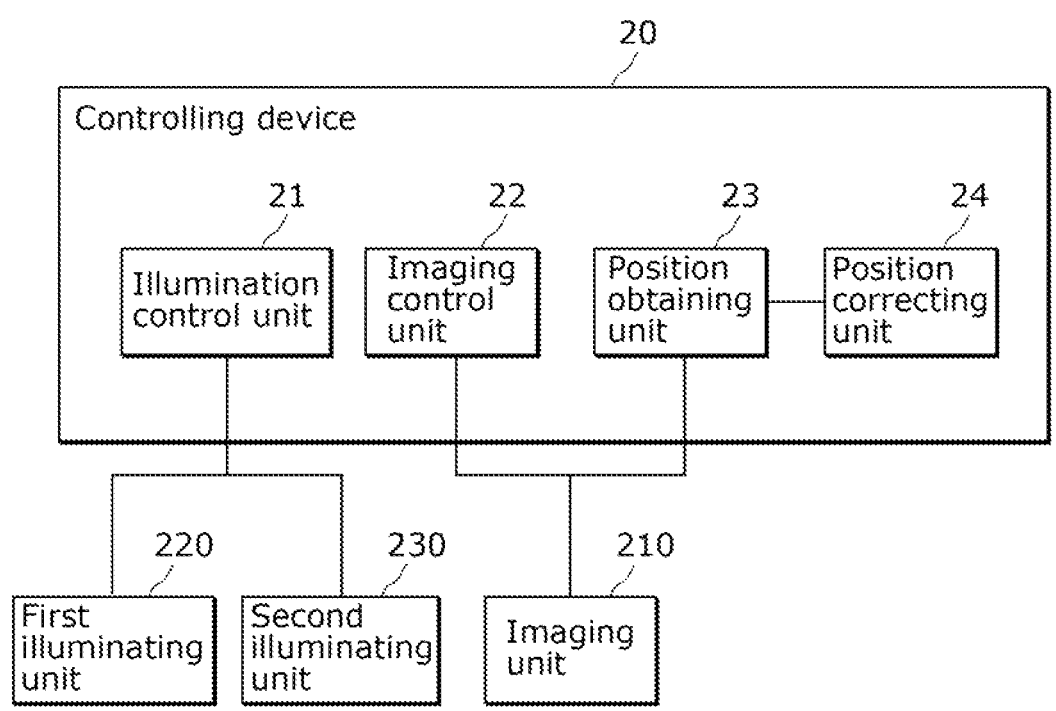
FIG. 6 is a block diagram showing a functional configuration of a controlling device according to the embodiment of the present invention.

FIG. 6 is a block diagram showing a functional configuration of a controlling device according to the embodiment of the present invention.

The controlling device 20 corrects a mounting position on the board 30 where the component mounter 10 mounts the component 40 held by the nozzle 110. As shown in FIG. 6, the controlling device 20 includes an illumination control unit 21, an imaging control unit 22, a position obtaining unit 23, and a position correcting unit 24.

The illumination control unit 21 causes the first illuminating unit 220 to emit light and illuminate the reflecting part 113 with light from the front. Furthermore, the illumination control unit 21 causes the second illuminating unit 230 to emit light and illuminate the component 40 held by the nozzle 110.

Using the light emitted from the first illuminating unit 220 and reflected off the reflecting part 113, the imaging control unit 22 causes the imaging unit 210 to capture the greatest outer periphery section 112b which is greater than the surface of a captured component held by the nozzle 110 positioned in the front section of the nozzle main body 111 provided in front of the reflecting part 113. Moreover, the imaging control unit 22 causes the imaging unit 210 to capture the component 40 using the light emitted to the component 40.

The position obtaining unit 23 obtains a reference position of the nozzle 110, based on the result of capturing the greatest outer periphery section 112b by the imaging unit 210. Moreover, the position obtaining unit 23 obtains a reference position of the component 40, based on the result of capturing the component 40 by the imaging unit 210.

The position correcting unit 24 corrects the position of the nozzle 110, using the reference position of the nozzle 110 obtained by the position obtaining unit 23. Specifically the position correcting unit 24 corrects the position of the nozzle 110 to correct the mounting position where the nozzle mounts the component 40, using a positional relationship between the nozzle 110 and the component 40. Here, the positional relationship is obtained from the reference position of the nozzle 110 and the reference position of the component 40, and the reference positions are obtained by the position obtaining unit 23.

Detailed next is how the controlling device 20 corrects the mounting position of the component 40 with respect to the board 30.

Figure 7:
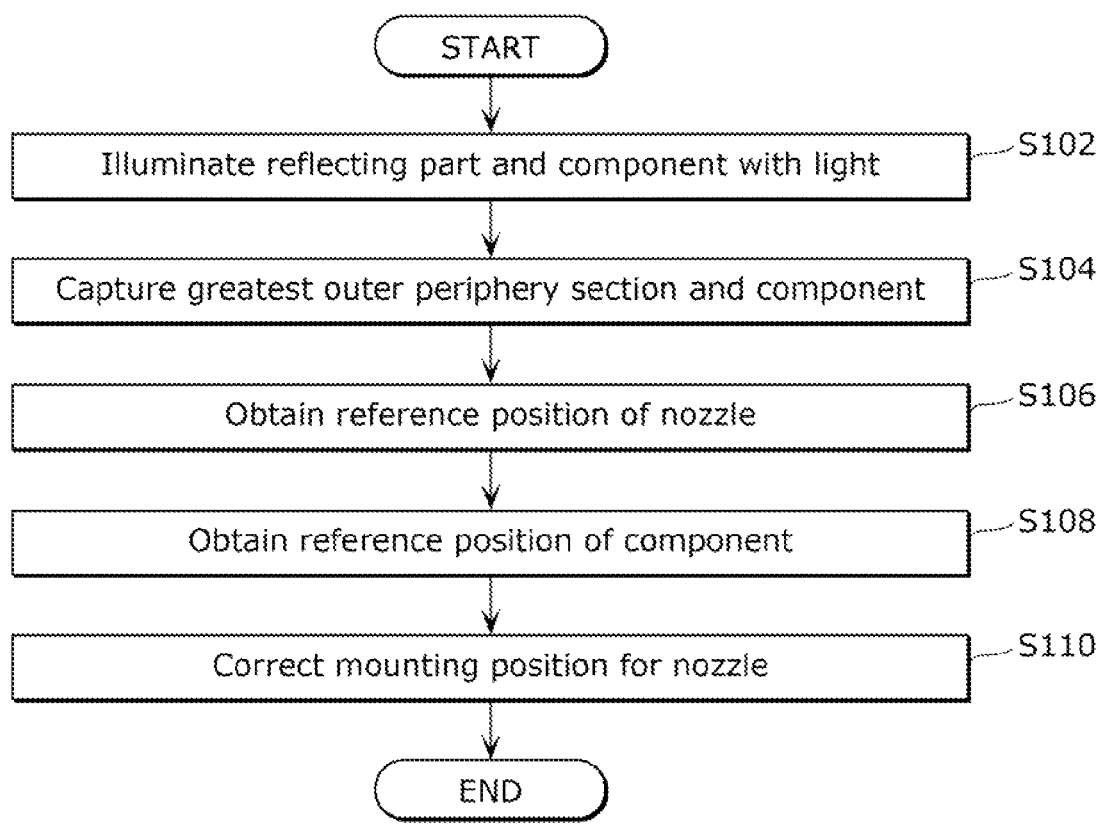
FIG. 7 is a flowchart showing how the controlling device according to the embodiment of the present invention corrects a mounting position of a component.

FIG. 7 is a flowchart showing how the controlling device 20 according to the embodiment of the present invention corrects the mounting position of the component 40.

Figure 8:
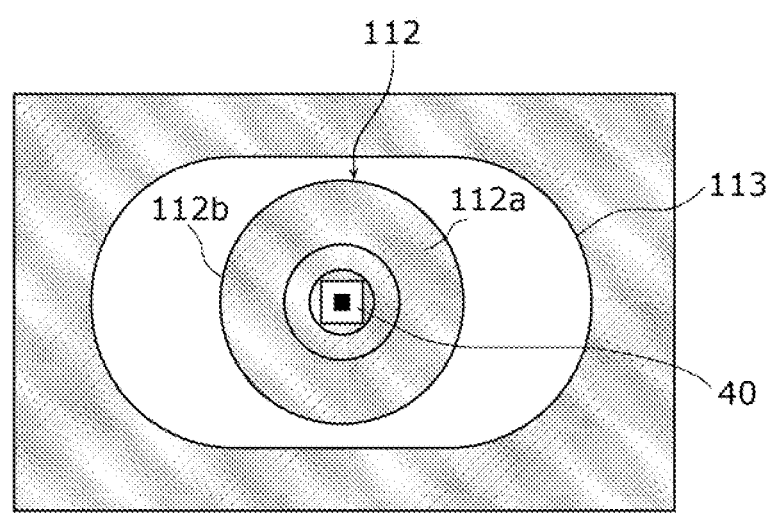
FIG. 8 is a block diagram showing how the controlling device according to the embodiment of the present invention corrects the mounting position of the component.
Figure 8:
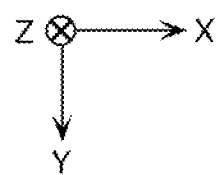

FIG. 8 is a block diagram showing how the controlling device 20 according to the embodiment of the present invention corrects the mounting position of the component 40.

As shown in FIG. 7, the illumination control unit 21 first illuminates the reflecting part 113 and the component 40 with light (S102). Specifically, the illumination control unit 21 causes the first illuminating unit 220 to emit light and illuminate the reflecting part 113 from front with the light. Furthermore, the illumination control unit 21 causes the second illuminating unit 230 to emit light and illuminate the component 40 held by the nozzle 110 with the light.

Here, as shown in FIG. 8, the reflecting part 113 and the component 40 are illuminated with the light and reflect the light off. It is noted that the frontal part 112a included in the greatest outer periphery 112 and having the greatest outer periphery section 112b as the outer periphery is non-reflective. Hence, the reflection of the light off the frontal part 112a is blocked.

Then, back to FIG. 7, the imaging control unit 22 causes the imaging unit 210 to capture the greatest outer periphery section 112b and the component 40 (S104). Specifically, the imaging control unit 22 causes the imaging unit 210 to capture the greatest outer periphery section 112b, using the light emitted by the first illuminating unit 220 and reflected off the reflecting part 113. Moreover, the imaging control unit 22 causes the imaging unit 210 to capture the component 40 using the light emitted to the component 40.

In the case where the greatest outer periphery section 112b is greater than the surface of the component 40 held by the nozzle 110, the imaging unit 210 can simultaneously capture both the greatest outer periphery section 112b and the component 40, which contributes to performing correction of misalignment with higher accuracy.

As shown in FIG. 8, the reflecting part 113 reflects the light off, and the non-reflective frontal part 112a blocks the reflection of the light. Such features keep the greatest outer periphery section 112b, which is the boundary between the reflecting part 113 and the frontal part 112a, from being blurry (reduces the blur) in capturing. Furthermore, in the case where the distance D1, which (Z-axis direction) stretches in the front-back (i.e., first) direction between the greatest outer periphery section 112b and the tip of the nozzle main body 111, either changes or becomes more or less (for example, approximately 0.5 times to 0.8 times greater than the distances D1 and D2 or approximately the distance of 1 mm to 2 mm) out of the depth of focus with which the imaging device 200 can practically obtain an image, the imaging device 210 can obtain a practically accurate image of the greatest outer periphery section 112b. In other words, the greatest outer periphery section 112b is positioned in the distance that allows the imaging unit 210 to get a sharp focus. Consequently, the imaging unit 210 can obtain an accurate image of the greatest outer periphery section 112b.

It is noted that, in the embodiment, the surface of the tip of the nozzle 110 holding the component 40 is also non-reflective. Illuminating the component 40 with light contributes to obtaining an accurate image of the component 40.

Then, back to FIG. 7, the position obtaining unit 23 obtains the reference position of the nozzle 110, based on the result of capturing the greatest outer periphery section 112b by the imaging unit 210 (S106). For example, the position obtaining unit 23 obtains the center of the greatest outer periphery section 112b as the reference position of the nozzle 110.

Moreover, the position obtaining unit 23 obtains the reference position of the component 40, based on the result of capturing the component 40 captured by the imaging unit 210 (S108). For example, the position obtaining unit 23 obtains the center of the component 40 as the reference position of the component 40.

The position correcting unit 24 then corrects the mounting position where the nozzle 110 mounts the component 40 (S110). Specifically, using a positional relationship between the nozzle 110 and the component 40, the position correcting unit 24 corrects the position of the nozzle 110 to correct the mounting position of the component 40 mounted by the nozzle. Here, the positional relationship is obtained from the reference positions, of the nozzle 110 and the component 40, that are obtained by the position obtaining unit. For example, the position correcting unit 24 corrects misalignment between the center of the greatest outer periphery section 112b and the center of the component 40 to correct the mounting position where the nozzle 110 mounts the component.

As described above, the component mounter 10 according to the embodiment includes the greatest outer periphery section 112b provided to the front section of the nozzle main body 111. The greatest outer periphery section 112b is positioned, when seen from the front of the nozzle main body 111 (i.e., when viewed along the first direction), the outermost part of the outer periphery of the nozzle main body 111 positioned in front of the reflecting part 113. The imaging unit 210 captures the greatest outer periphery section 112b using the light reflected off the reflecting part 113 behind the nozzle main body 111. In other words, the greatest outer periphery section 112b is provided to the front section of the nozzle main body 111. This feature allows the imaging unit 210 to practically get a sharp focus to capture the greatest outer periphery section 112b, and the obtained image of the greatest outer periphery section 112b is accurate. Moreover, the image of the greatest outer periphery section 112b is obtained not with the light with which the greatest outer periphery section 112b is illuminated. Instead, the image of the greatest outer periphery section 112b, which is positioned in the front section of the nozzle main body 111, is obtained with the light reflected off the reflecting part 113 behind the nozzle main body 111. As a result, such a feature keeps the outline of the greatest outer periphery section 112b from being blurry, and contributes to obtaining an accurate image of the greatest outer periphery section 112b. Consequently, the component mounter 10 can precisely recognize the position of the nozzle 110, and accurately correct misalignment caused when the component 40 is mounted on the board 30.

Moreover, the nozzle main body 111 includes the frontal part 112a provided opposite the imaging unit 210 and having the greatest outer periphery section 112b as the outer periphery of the frontal part 112a. Here, the frontal part 112a is non-reflective. Hence, the component mounter 10 can accurately perform transmissive recognition for capturing a silhouette of the greatest outer periphery section 112b, using the light reflected off the reflecting part 113. Consequently, the component mounter 10 can precisely recognize the position of the nozzle 110, and accurately correct misalignment caused when the component 40 is mounted on the board 30.

Moreover, the greatest outer periphery section 112b is positioned at the distance of, for example, 0.4 mm to 4 mm away from the tip of the nozzle 110 in the front-back direction. In other words, the greatest outer periphery section 112b is provided to a position which allows the imaging unit 210 to get a practically sharp focus in consideration of the depth of focus of the imaging unit 210. This feature allows the imaging unit 210 to practically get a sharp focus and obtain an accurate image of the greatest outer periphery section 112b. Consequently, the component mounter 10 can precisely recognize the position of the nozzle 110, and accurately correct misalignment caused when the component 40 is mounted on the board 30.

Moreover, the nozzle main body 111 includes a separate part for the greatest outer periphery 112 having the greatest outer periphery section 112b in the outer periphery. Hence, the greatest outer periphery 112 is manufactured and attached to the nozzle main body 111, which forms the nozzle 110 having the greatest outer periphery section 112b in the front section of the nozzle main body 111. Such a feature contributes to simple manufacturing of the nozzle 110 and reduction of the manufacturing cost.

Furthermore, the component mounter 10 obtains the reference position of the nozzle 110 from the result of capturing the greatest outer periphery section 112b by the imaging unit 210, and corrects the position of the nozzle 110. Such features make it possible to precisely correct the position of the nozzle 110, using the reference position of the nozzle 110. Consequently, the component mounter 10 can accurately correct misalignment caused when the component 40 is mounted on the board 30.

In addition, the component mounter 10 obtains the reference position of the component 40 based on the result of capturing the component 40 by the imaging unit 210. Then, the component mounter 10 corrects the position of the nozzle 110 to correct the mounting position where the nozzle 110 mounts the component 40, using a positional relationship between the nozzle 110 and the component 40, the positional relationship being obtained from the reference position of the nozzle 110 and the reference position of the component 40. Such features make it possible to precisely correct the position of the nozzle 110, using the reference positions of the nozzle 110 and the component 40. Consequently, the component mounter 10 can accurately correct misalignment caused when the component 40 is mounted on the board 30.

The nozzle 110 according to the embodiment includes the nozzle main body 111, and the reflecting part 113 behind the nozzle main body 111. The nozzle main body 111 includes the greatest outer periphery section 112b provided to the front section of the nozzle main body 111, and the greatest outer periphery section 112b is positioned when seen from front, in the outermost part of the outer periphery of the nozzle main body 111. When capturing the greatest outer periphery section 112b provided to the front section of the nozzle main body 111, the above features allow the component mounter 10 to practically get a sharp focus to capture the greatest outer periphery section 112b, and the obtained image of the greatest outer periphery section 112b is accurate. Furthermore, the component mounter 10 captures the greatest outer periphery section 112b using light reflected off the reflecting part 113 behind the nozzle main body 111. Such a feature makes the outline of the greatest outer periphery section 112b less blurry than directly illuminating with light for capturing the greatest outer periphery section 112b, and contributes to obtaining an accurate image of the greatest outer periphery section 112b. Consequently, the component mounter 10 can precisely recognize the position of the nozzle 110, and the nozzle 110 can accurately correct misalignment caused when the component 40 is mounted on the board 30.

A component mounting position correcting method according to the embodiment is used for correcting a mounting position where the nozzle 110 mounts the component 40. The method involves capturing the greatest outer periphery section 112b with light emitted to and reflected off the reflector 113, obtaining the reference position of the nozzle 110 based on the result of capturing the greatest outer periphery section 112b, and correcting the position of the nozzle 110 using the reference position of the nozzle 110. Such features make it possible to precisely correct the position of the nozzle 110, using the reference position of the nozzle 110. Consequently, the component mounter 10 can accurately correct misalignment caused when the component 40 is mounted on the board 30.

Furthermore, the component mounting position correcting method involves capturing the component 40 with light emitted to the component 40, obtaining the reference position of the component 40 based on the captured image of the component 40. Then the component mounting position correcting method involves correcting the position of the nozzle 110 to correct the mounting position where the nozzle 110 mounts the component 40. Such features make it possible to precisely correct the position of the nozzle 110, using the reference positions of the nozzle 110 and the component 40. Consequently, the component mounter 10 can accurately correct misalignment caused when the component 40 is mounted on the board 30.

In the case where the greatest outer periphery section 112b is greater than the surface of the component 40 held by the nozzle 110, the component mounting position correcting method makes it possible to simultaneously capture both the greatest outer periphery section 112b and the component 40, which contributes to performing correction of misalignment with higher accuracy.

It is noted that the present invention can be implemented not only as the component mounting position correcting method but also as a program and an integrated circuit to cause a computer to execute the characteristic processing included in the component mounting position correcting method. As a matter of course, the program may be distributed via a recording medium such as a CD-ROM and a transmission medium such as the Internet.

Described next are modifications of the embodiment. In the embodiment, the nozzle 110 includes the doughnut-shaped greatest outer periphery 112; however, the shape of the greatest outer periphery 112 shall not be limited. Described hereinafter are various shapes that the greatest outer periphery 112 can be formed into, with reference to FIGS. 9A to 10B.

[Modification 1]

Figure 9A:
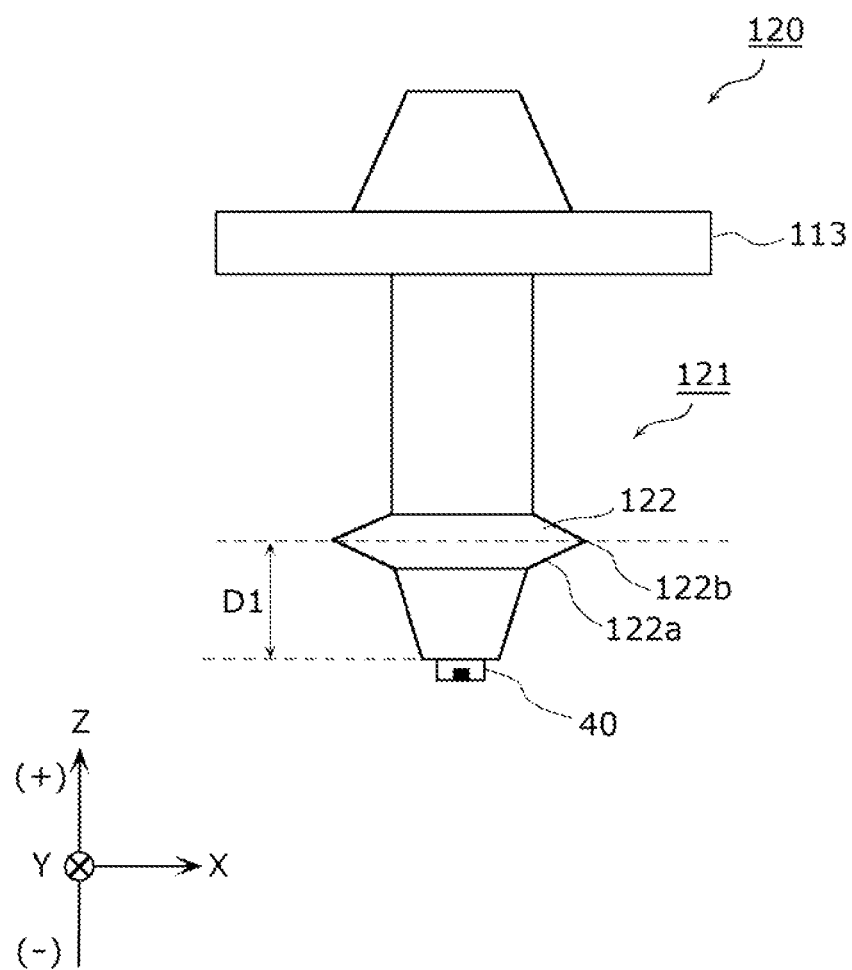
FIG. 9A is a diagram showing a structure of a greatest outer periphery included in a nozzle main body of a nozzle according to Modification 1 of the embodiment.

FIG. 9A is a diagram showing a structure of a greatest outer periphery 122 included in a nozzle main body 121 of a nozzle 120 according to Modification 1 of the embodiment.

As shown in FIG. 9A, the greatest outer periphery 122 according to Modification 1 includes an edge part whose width in the front-back direction (Z-axis direction) reduces toward a greatest outer periphery section 122b in a direction perpendicular (X-axis direction or Y-axis direction) to the front-back direction. In other words, the tip of the edge portion is the greatest outer periphery section 122b.

Moreover, the greatest outer periphery section 122b is positioned at the distance D1 (Z-axis direction) away from the tip of the nozzle main body 121 in the front-back direction. It is noted that a non-reflective (surface on the Z-axis minus side) frontal part 122a is a frontal part of the greatest outer periphery 122.

As described above, in the component mounter 10 according to Modification 1 of the embodiment, the nozzle main body 121 includes the edge part whose width in the front-back direction reduces toward the greatest outer periphery section 122b. Such features allow the component mounter 10 to capture the edge part, such that the outline of the greatest outer periphery section 122b is less blurry, which contributes to obtaining an accurate image of the greatest outer periphery section 122b. Consequently, the component mounter 10 can precisely recognize the position of the nozzle 120, and accurately correct misalignment caused when the component 40 is mounted on the board 30.

[Modification 2]

Figure 9B:
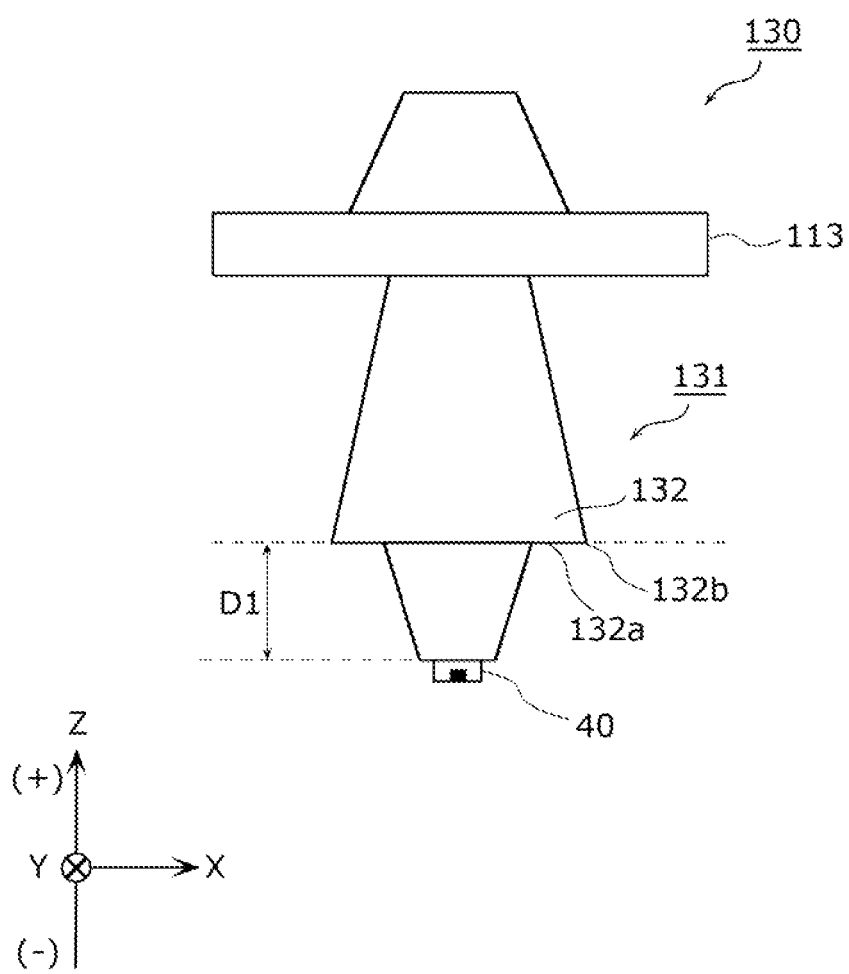
FIG. 9B is a diagram showing a structure of a greatest outer periphery included in a nozzle main body of a nozzle according to Modification 2 of the embodiment.

FIG. 9B is a diagram showing a structure of a greatest outer periphery 132 included in a nozzle main body 131 of a nozzle 130 according to Modification 2 of the embodiment.

As shown in FIG. 9B, the greatest outer periphery 132 according to Modification 2 includes an edge part whose width in the front-back direction (Z-axis direction) reduces toward a greatest outer periphery section 132b in a direction perpendicular (X-axis direction or Y-axis direction) to the front-back direction. The edge part is shaped such that the distance between the outer periphery and the axis of the nozzle main body 13 decreases as the edge part stretches further back (Z-axis plus direction).

In other words, the greatest outer periphery section 132b is formed at the tip of the edge part, and the nozzle main body 13 is formed in a candle-like shape. It is noted that the greatest outer periphery section 132b positioned at the distance D1 (Z-axis direction) away from the tip of the nozzle main body 131 in the front-back direction. Moreover, a frontal part 132a is a non-reflective frontal part of the greatest outer periphery 132 (surface on the Z-axis minus side).

[Modification 3]

Figure 10A:
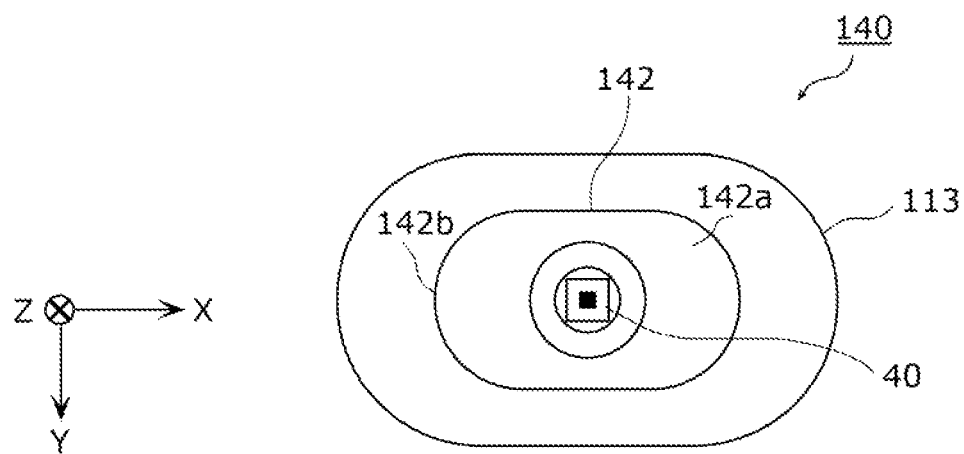
FIG. 10A is a diagram showing a structure of a greatest outer periphery included in a nozzle according to Modification 3 of the embodiment.

FIG. 10A is a diagram showing a structure of a greatest outer periphery 142 included in a nozzle 140 according to Modification 3 of the embodiment.

As shown in FIG. 10A, the greatest outer periphery 142 according to Modification 3 is an oval one when seen from the front (Z-axis minus side). In other words, a greatest outer periphery section 142b is oval. It is noted that a frontal part 142a is a non-reflective frontal part of the greatest outer periphery 142 (surface on the Z-axis minus side).

[Modification 4]

Figure 10B:
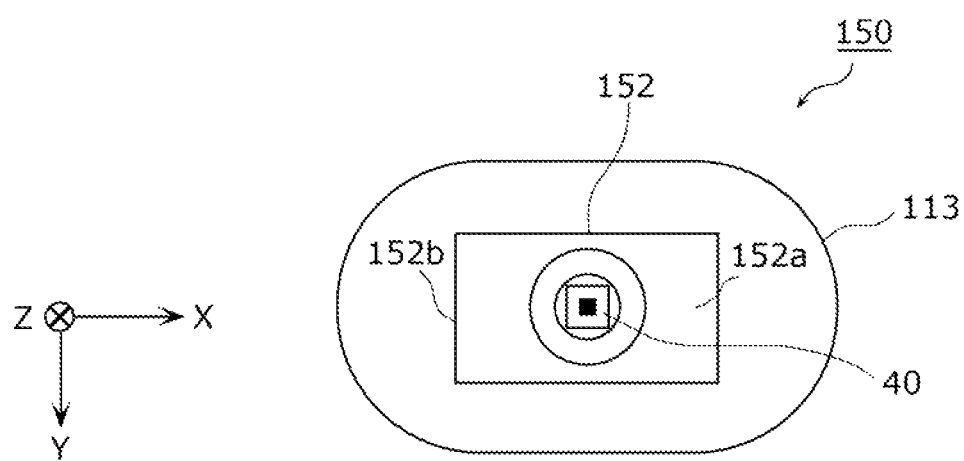
FIG. 10B is a diagram showing a structure of a greatest outer periphery included in a nozzle according to Modification 4 of the embodiment.

FIG. 10B is a diagram showing a structure of a greatest outer periphery 152 included in a nozzle 150 according to Modification 4 of the embodiment.

As shown in FIG. 10B, the greatest outer periphery 152 according to Modification 4 is a rectangular one when seen from the front (Z-axis minus side). In other words, a greatest outer periphery section 152b is rectangular. It is noted that a frontal part 152a is a non-reflective frontal part of the greatest outer periphery 152 (surface on the Z-axis minus side).

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

The disclosed embodiment and the modifications thereof are examples in all respects, and therefore shall not be defined as they are. The scope of the invention shall be defined not by the above descriptions but by claims, and shall include all modifications which are equivalent to and within the scope of the claims.

The present invention is applicable to a component mounter which can precisely correct misalignment caused when a component is mounted on a board.

The invention claimed is:

1. A component mounting position correcting method for correcting a mounting position on a board where a component mounter mounts a component held by the mounter, the component mounter including a nozzle having a front configured to hold the component, and a rear disposed in a first direction rearward of the front, the nozzle including:
    a reflecting part that reflects light forwardly, toward the front, upon receiving the light from a location forward of the reflecting part; and
    a nozzle main body as a main body of the nozzle and provided forward of the reflecting part,
    the nozzle main body including:
    a greatest outer periphery section provided to a forward section of the nozzle main body, the greatest outer periphery section being positioned, when viewed along the first direction, in an outermost part of an outer periphery of the nozzle main body; and
    an edge part whose width in the first direction reduces toward the greatest outer periphery section in a direction perpendicular to the first direction, and
    the component mounting position correcting method comprising:
    illuminating the reflecting part with the light from the location forward of the reflecting part;
    capturing the greatest outer periphery section, using the light in said illuminating that is reflected off the reflecting part;
    obtaining a reference position of the nozzle based on a result of said capturing of the greatest outer periphery section; and
    correcting a position of the nozzle to correct the mounting position where the nozzle mounts the component, using the obtained reference position of the nozzle.

2. The component mounting position correcting method according to claim 1,
    wherein the edge part is shaped such that a distance between the outer periphery and an axis of the nozzle main body decreases as the outer periphery stretches further rearward.

3. The component mounting position correcting method according to claim 1,
    wherein the greatest outer periphery section is positioned at a distance of 4 mm or shorter away from the tip front face of the front tip of the nozzle main body in the first direction.

4. The component mounting position correcting method according to claim 1,
    wherein the greatest outer periphery of the nozzle main body is disposed at a position spaced apart forwardly from the reflecting part.

5. The component mounting position correcting method according to claim 4,
    wherein the edge part projects radially outwardly from a remainder of the nozzle main body.

6. The component mounting position correcting method according to claim 1,
    wherein the edge part projects radially outwardly from a remainder of the nozzle main body.

* * * * *